United States Patent

[11] 3,607,477

[72] Inventors Ravi Rao
London, England;
Robert I. Bradshaw, Kampala, Uganda, East Africa
[21] Appl. No. 807,959
[22] Filed Mar. 17, 1969
[45] Patented Sept. 21, 1971
[73] Assignee Westinghouse Brake English Electric Semiconductors, Limited
London, England
[32] Priority Mar. 21, 1968
[33] Great Britain
[31] 13,619/68

[54] ETCHANTS, THE TREATMENT OF MONCRYSTALLINE SEMICONDUCTOR WAFERS THEREWITH AND SEMICONDUCTOR DEVICES INCORPORATING SUCH WAFERS
1 Claim, No Drawings

[52] U.S. Cl. .......... 156/17, 134/2, 252/79.4, 252/79.5
[51] Int. Cl. .......... H01l 7/50
[50] Field of Search .......... 156/17; 252/79.4, 79.5; 134/2

[56] References Cited

UNITED STATES PATENTS

| | | | |
|---|---|---|---|
| 2,736,639 | 2/1956 | Ellis | 252/79.4 |
| 2,739,883 | 3/1956 | Newman | 252/79.5 |
| 2,882,134 | 4/1959 | Spring et al. | 252/79.5 |
| 3,288,662 | 11/1966 | Weisberg | 156/11 |
| 3,486,892 | 12/1969 | Rosvold | 96/36.2 |

*Primary Examiner*—Jacob H. Steinberg
*Attorney*—Larson, Taylor and Hinds

ABSTRACT: This method involves the use of a solution of gluconic acid and caustic alkali to remove contaminants from a silicon wafer mounted for processing on a header.

ETCHANTS, THE TREATMENT OF MONCRYSTALLINE SEMICONDUCTOR WAFERS THEREWITH AND SEMICONDUCTOR DEVICES INCORPORATING SUCH WAFERS

This invention relates to etchants and, more particularly, although not exclusively, to alkali-etchants, to the treatment of monocrystalline semiconductor wafers with such etchants, and semiconductor devices incorporating such wafers.

The present invention provides, firstly, an etchant having a pH value of between 3 and 14 inclusive and incorporating a sequestering agent.

The pH value may be determined by the volume of potassium hydroxide in the etchant.

The sequestering agent is gluconic acid.

The present invention also provides, secondly, a method of treatment of a monocrystalline semiconductor wafer, in which method the wafer is etched in an etchant of the kind described above.

The etchant, in such treatment, may be at an elevated temperature, the elevated temperature preferably being within the range 80° C. – 100° C. and, advantageously, at 100° C.

Prior to the treatment with the etchant, the wafer may have been treated with an acid-etchant, for example, a mixture of hydrofluoric acid and nitric acid.

Subsequent to the treatment in the etchant, the wafer may be washed in distilled water.

During the etchant treatment, the opposed planar faces of the wafer may be protected by suitable masks which may be constituted by a layer on each of the opposed planar faces of, for example, acid-resistant gold-plating or lead solder.

During the treatment with the etchant, the wafer may be mounted on a header.

The present invention further provides, thirdly, a semiconductor device incorporating a wafer of semiconductor material treated as above described.

Embodiments of the present invention will now be described in greater detail, by way of example, with reference to the following example:

EXAMPLE NO. 1.

A wafer was cut from a slice of silicon monocrystalline semiconductor material, the wafer then having opposed planar surfaces between which extended a peripheral surface.

By the cutting of the wafer from the slice, the peripheral face of the wafer would be damaged and, to remove this damage, the wafer was first etched in an acid-etchant constituted by a conventional mixture of hydrofluoric and nitric acid in the proportion 7:3.

The opposed planar faces of the wafer were then coated with an acid-resistant gold-plating and the thus plated wafer mounted on a header to facilitate subsequent handling of the wafer. The mounting of the wafer on the header necessitated a furnacing operation during which the surfaces (and, in particular, the peripheral face) of the wafer inevitably became contaminated with metal ions present in the jigs necessary for the mounting of the wafer, the various components of the assembly and the furnace gases etc.

If these contaminants are allowed to remain, their presence leads to a deterioration of the electrical characteristics of any device made with the wafer.

For the removal of these metal ion contaminants, the wafer was then immersed in an alkali etchant whose temperature was 100° C.

The alkali etchant consisted of a solution of gluconic acid and potassium hydroxide the volume of which in the solution was adjusted to give a pH value of 9–10.

Subsequent to the treatment in the alkali-etchant the wafer was washed in distilled water and then dried.

Typically, wafers which had been treated as above described with the exception of the alkali-etchant stage, showed reverse leakages of greater than 100 microamperes at voltages of 100 – 500 volts.

In comparison, of wafers treated with the alkali-etchant, 80 – 90 percent of the wafers showed reverse leakages of less than 1 microampere at 1,000 volts, a typical figure of 10 manoamperes being readily attained.

It is believed that the chemical reaction which took place in the alkali-etchant treatment was, for the ion contamination as follows:

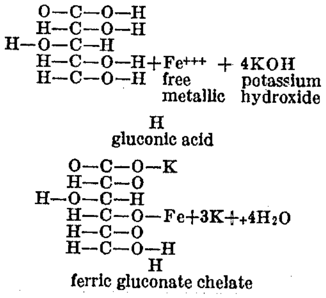

In the above example, the opposed planar faces of the wafer were specified as being masked by the coating thereof with an acid-resistant gold-plating but, alternatively, a lead solder may be used.

In the above example, the alkali etchant was specified as being at a temperature of 100° C. but other temperatures may be used, for example, any temperature within the range 80° C. – 100° C. inclusive.

Similarly, although the pH value of the etchant was specified above as being 9–10, the pH value may lie anywhere within the range 3–14 inclusive.

Having thus described our invention what we claim is:

1. A method of removing contaminants from a silicon semiconductor wafer, mounted on a header which comprises etching said wafer with an etchant consisting essentially of a mixture of caustic alkali and gluconic acid, said etchant having a pH of 9–10 and said etching being carried out at a temperature within the range of 80° C. to 100° C.